(12) United States Patent
Iijima et al.

(10) Patent No.: US 6,351,031 B1
(45) Date of Patent: Feb. 26, 2002

(54) SEMICONDUCTOR DEVICE AND METHOD FOR MANUFACTURING SUBSTRATE OF THE SAME

(75) Inventors: Makoto Iijima; Masaru Nukiwa; Seiji Ueno; Muneharu Morioka, all of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/533,173

(22) Filed: Mar. 22, 2000

(30) Foreign Application Priority Data

Oct. 12, 1999 (JP) ............................................. 11-289937

(51) Int. Cl.⁷ .............................................. H01L 23/04
(52) U.S. Cl. ........................ 257/698; 257/783; 257/635
(58) Field of Search ................................. 257/698, 783, 257/635, 642, 643, 778; 361/792, 795, 748; 174/255, 258, 259, 262, 263, 264, 266

(56) References Cited

U.S. PATENT DOCUMENTS

| | | | |
|---|---|---|---|
| 4,640,866 A | * | 2/1987 | Suzuki |
| 4,729,061 A | * | 3/1988 | Brown |
| 5,280,192 A | * | 1/1994 | Kryzaniwsky |
| 5,952,713 A | * | 9/1999 | Takahira et al. |
| 6,187,652 B1 | * | 2/2001 | Chou et al. |

FOREIGN PATENT DOCUMENTS

| | | | |
|---|---|---|---|
| JP | 60-16701 | * | 1/1985 |
| JP | 62-156847 | * | 7/1987 |
| JP | 11-54934 | | 2/1999 |

* cited by examiner

*Primary Examiner*—Sheila V. Clark
(74) *Attorney, Agent, or Firm*—Armstrong, Westerman, Hattori, McLeland & Naughton, LLP

(57) ABSTRACT

A semiconductor device includes a multi-flexible substrate and semiconductor chips mounted thereon. The multi-flexible substrate is configured such that organic insulation substrate layers and filmy adhesive layers are alternatively stacked together and wiring layers formed therein are interconnected by means of vias. Each of the vias consisting of a via-hole which is formed penetrating both the organic insulation substrate layers and the filmy adhesive layers and a metal via member 26 which is provided in the via-hole and made of an identical material. A method of manufacturing the multi-flexible substrate for the semiconductor device is also disclosed.

2 Claims, 10 Drawing Sheets

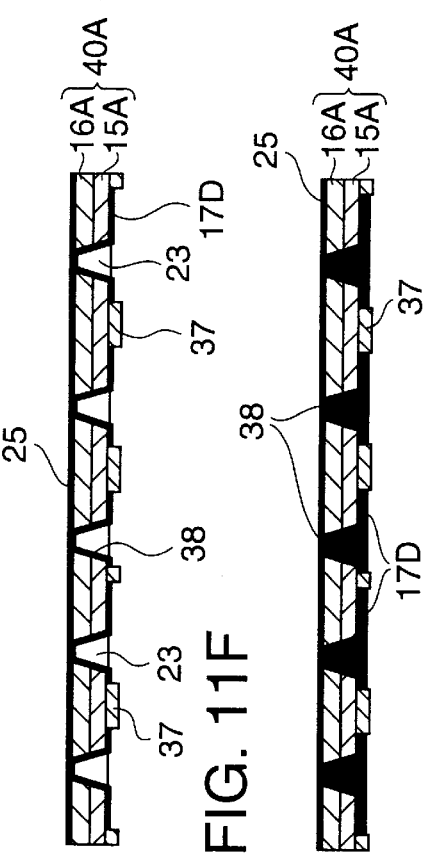
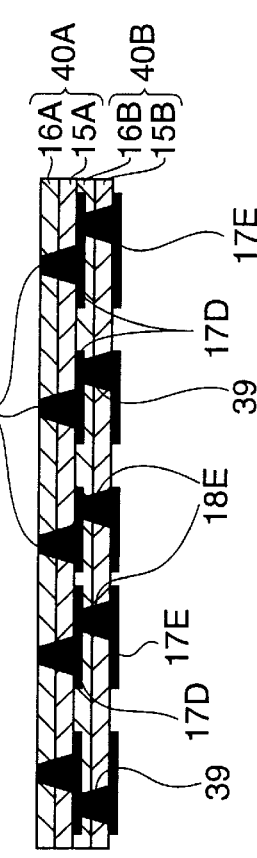
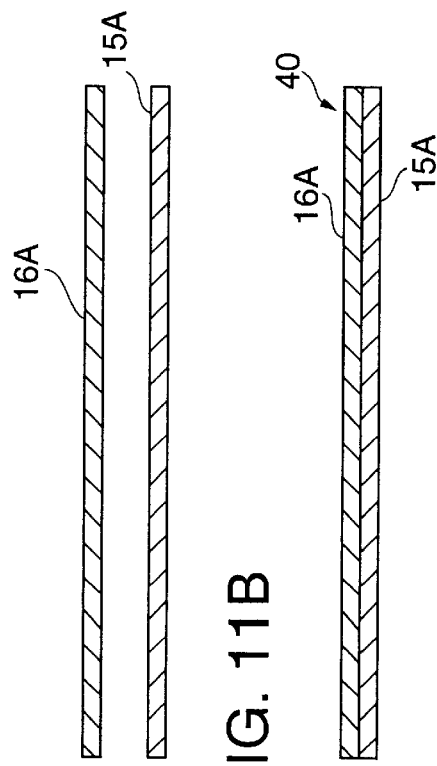
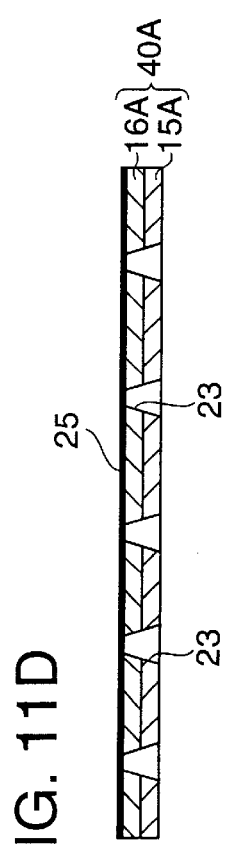
FIG. 11A
FIG. 11B
FIG. 11C
FIG. 11D
FIG. 11E
FIG. 11F
FIG. 11G
FIG. 11H

SEMICONDUCTOR DEVICE AND METHOD FOR MANUFACTURING SUBSTRATE OF THE SAME

BACKGROUND OF THE INVENTION

1. Field of the Invention

The present invention generally relates to semiconductor devices and methods for manufacturing substrates thereof, and more particularly to a semiconductor device and a method for manufacturing a substrate of the semiconductor device, in which one or a plurality of semiconductor chips are mounted on the substrate thereof.

In recent years, with increasing development of semiconductor chips with high density, the number of terminals provided on the semiconductor chips has also increased. Currently, a semiconductor devices such as a BGA (ball grid array) type semiconductor device or the like, where a semiconductor chip(s) is (are) mounted on a substrate thereof, has been widely used all over the world.

Accordingly, the substrate where the semiconductor chip (s) is (are) mounted is also required to have density high enough to support the increase in the number of the terminals of the mounted semiconductor chip(s).

2. Description of the Related Art

Conventionally, the substrate of the semiconductor device commonly has a multi-layer structure. In the well-known multi-layer structure, a build-up layer is applied to a ceramic multi-layer substrate or to a print wiring substrate by means of a build-up process. The semiconductor chip(s) may be bonded to the multi-layer substrate in a face-down state.

With respect to a method of manufacturing the multi-layer substrate, in a case of the ceramic multi-layer substrate, the method may comprise the steps of:

forming a plurality of via-holes in a green sheet;

filling the plurality of via-holes with conductive materials such as tungsten pastes and so on;

forming a wiring pattern on the green sheet by means of a printing process;

stacking a plurality of the green sheets and then pressing them together; and sintering the pressed green sheets by a sintering process.

In a case of the printed multi-layer substrate, the method may comprise the steps of:

forming a pattern on a glass-epoxy layer with copper leaf;

stacking a plurality of the glass-epoxy layers with adhesive;

forming a plurality of through-holes on the glass-epoxy layers with a drill;

plating the through-holes with copper so as to form a core substrate available for making electrical interconnections among the layers;

forming an insulation layer on the core substrate; and forming a wiring pattern on the insulation layer by means of a subtractive process or a semi-additive process, and then repeating this step until the build-up layer is completed.

Further, Japan Laid-open Patent Application No.11-54934 discloses a multi-layer wiring substrate for the semiconductor device. The disclosed multi-layer wiring substrate is formed such that a plurality of filmy single-side circuit substrates are stacked on both two opposing surfaces of the core substrate where a plurality of the through-holes are formed.

The filmy single-side circuit substrates each includes an insulation base and an adhesive layer that is provided on the insulation base. The insulation base has a plurality of via-holes and a wiring layer connected to the plurality of via-holes. Further, on the plurality of via-holes, there are respectively provided a plurality of bumps that protrude from the insulation base and are electrically connected to the via-holes.

Since the adhesive layer is provided on the insulation base, the plurality of bumps is positioned within the adhesive layer. The single-side circuit substrates, which are thus configured, are stacked together by means of a pressing-and-heating process, and the inter-layer connection is realized by connecting the plurality of bumps to the wiring layer.

However, in a case where the ceramic multi-layer substrate is used as a semiconductor device substrate, since the wiring pattern is formed by means of the printing process, this case suffers from a disadvantage that there is a limit to form a fine pattern. For this reason, the ceramic multi-layer substrate are not suitable for the semiconductor device where the density of the semiconductor chip(s) mounted thereon is further increased as well as the number of the connecting terminals.

Further, it should be considered that the green sheet shrinks during sintering of the ceramic multi-layer substrate. For this reason, land diameters thereof must be designed big enough to receive the inter-layer vias. But this also suffers from a disadvantage that wiring rules cannot be made fine enough. Furthermore, another disadvantage of widely using the ceramic multi-layer substrate is the high cost of ceramic materials.

On the other hand, in a case where the print substrate is used as the semiconductor device substrate on which the build-up layer is formed and the fine wires are laid, the semiconductor device substrate can become a multi-layer substrate by repeating a process of laying the wires and forming the vias on each layer by means of a film forming technology such as the exposing and the developing. However, this case is costly, time-consuming, and limited in the number of the stacked layers.

Moreover, Japanese Laid-open Patent Application No. 11-54934 discloses a multi-layer wiring substrate. In the disclosed multi-layer wiring substrate, a single-side circuit substrate includes an insulation substrate and an adhesive layer, where the via-holes are formed on the insulation substrate and bumps are formed on the adhesive layer. In this configuration, however, the via-holes and the bumps should be joined to each other on a boundary surface between the insulation substrate and the adhesive layer.

Thus, the via-holes and the bumps are provided separately and thereby the strengths on joints between the via-holes and the bumps become weak. Accordingly, during the mounting of the semiconductor device, the insulation substrate and the adhesive layer are heated, and a stress resulting from a difference in coefficient of thermal expansion therebetween is applied to the joints between the via-holes and the bumps. As a result, the joints between the via-holes and the bumps may be damaged by the stress.

SUMMARY OF THE INVENTION

It is a general object of the present invention to provide a semiconductor device and a method for manufacturing a substrate thereof, in which the above disadvantages can be overcome.

Another and a more specific object of the present invention is to provide a semiconductor device and a method for manufacturing the substrate thereof, in which high density, high reliability and low cost of wire layers and vias provided therein can be achieved.

The above objects and other objects of the present invention are achieved by a semiconductor device, comprising:

a substrate having a plurality of organic insulation substrate layers and a plurality of adhesive layers which are alternatively stacked, and inter-layer wires which are laid among said stacked layers and are electrically interconnected by using vias; and a semiconductor chip mounted on said substrate;

said vias each having a via-hole which is formed penetrating said organic insulation substrate layers and said adhesive layers and a metal via member which is disposed in said via-hole and made of an identical material.

The above-mentioned objects of the present invention can be obtained by a method for manufacturing a substrate, said substrate having a plurality of organic insulation substrate layers and a plurality of adhesive layers which are alternatively stacked, and inter-layer wires which are laid among said stacked layers and are electrically interconnected by using vias formed by providing metal materials in via-holes, said manufacturing method comprising the steps of:
(a) stacking said adhesive layers and said organic insulation substrate layers alternatively so as to form a substrate body;
(b) forming said via-holes such that said via-holes penetrate said substrate body;
(c) forming a conductive metal film so that the conductive metal film covers said via-holes on one side of said substrate body;
(d) using an electrolytic plating process, where said conductive metal film is used as an electrode, to form said metal via members within said via-holes and at the same time to form said inter-layer wires in said substrate body; and
(e) thereafter, removing said conductive metal film.

A better understanding of the features and advantages of the present invention will be obtained by reference to the following detailed description of the invention and accompanying drawings which set forth an illustrative embodiment in which the principles of the invention are utilized.

BRIEF DESCRIPTION OF THE DRAWINGS

FIGS. 11A through 11H illustrate a method for manufacturing a multi-layer flexible substrate, where vias and wiring layers are simultaneously formed, in accordance with the present invention.

DETAILED DESCRIPTION OF THE PREFERRED EMBODIMENTS

With reference to the drawings, preferred embodiments of the present invention will be described below.

Figure 1:
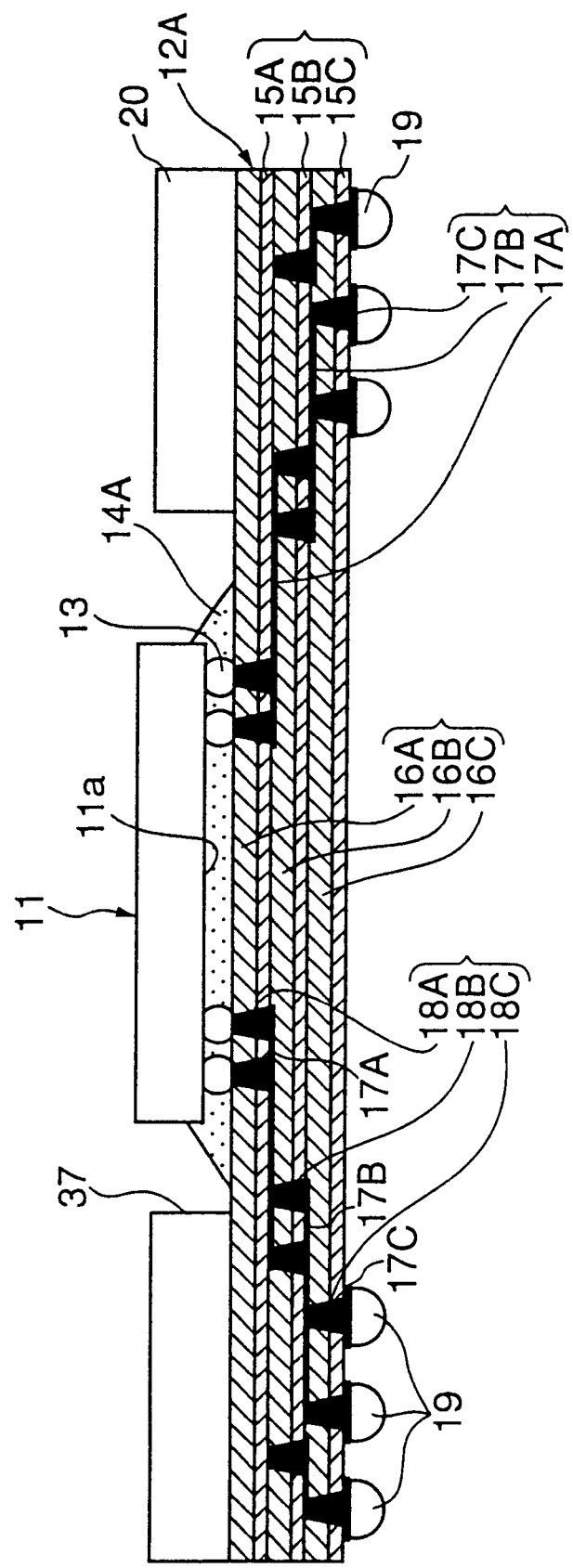
FIG. 1 is a cross-sectional view showing a semiconductor device of a first embodiment according to the present invention.

FIG. 1 is a cross-sectional view showing a semiconductor device 10A of a first embodiment according to the present invention. As show in this diagram, the semiconductor device 10A has the BGA (ball grid array) structure, which comprises a semiconductor chip 11, a multi-layer flexible substrate 12A, and a plurality of solder balls 19.

Since the semiconductor chip 11 is a semiconductor chip with high density, it has a plurality of terminals formed on a mounting surface 11a thereof. On the plurality of terminals, there are in advance provided a plurality of solder bumps 13, respectively. The semiconductor chip 11 is bonded to the multi-layer flexible substrate 12A in a face-down state. Between the semiconductor chip 11 and the multi-layer flexible substrate 12A, underfill resin 14A is introduced so as to avoid a stress, which results from a difference in coefficient of thermal expansion therebetween, being concentrically applied to the plurality of bumps 13.

The multi-layer flexible substrate 12A includes a plurality of organic insulation substrate layers 15A through 15C, a plurality of filmy adhesive layers 16A through 16C, a plurality of wiring layers 17A through 17C, and a plurality of via-holes 18A through 18C.

The plurality of organic insulation substrate layers 15A through 15C are filmy and flexible substrate layers which are made of organic resin such as epoxy resin, polyimide resin, or the like, and have a dielectric constant of 1.5–5.0. Thus, by using these thin resin films with the low dielectric constant to form the organic insulation substrate layers 15A through 15C, electric properties (particularly, high frequency properties) of the multi-layer flexible substrate 12A can become well. In addition, the wiring layers 17A through 17C are formed under the organic insulation substrate layers 15A through 15C.

On the other hand, the adhesive layers 16A through 16C, which are filmy layers the same as the organic insulation substrate layers 15A through 15C, are made of thermal-cured or photo-cured epoxy resin, polyimide resin, silicon resin, or cyanate ester resin. In a state of being stacked, the adhesive layers 16A through 16C serves to contact the organic insulation substrate layers 15A through 15C as shown in FIG. 1.

The organic insulation substrate layers 15A through 15C and the adhesive layers 16A through 16C, are alternately stacked together. That is, the organic insulation substrate layer 15A and the adhesive layer 16A, the organic insulation substrate layer 15B and the adhesive layer 16B, and the organic insulation substrate layer 15C and the adhesive layer 16C, are respectively paired with each other.

The vias 18A through 18C each includes a via-hole 23 penetrating both of the organic insulation substrate layers 15A through 15C and the adhesive layers 16A through 16C, and a metal via member 26 provided in the via-hole 23 (see FIGS. 2C to 2E). Specifically, the via 18A is configured to go through the organic insulation substrate layer 15A and the adhesive layer 16A, the via 18B to go through the organic insulation substrate layer 15B and the adhesive layer 16B, and the via 18C to go through the organic insulation substrate layer 15C and the adhesive layer 16C.

With respect to the via 18A, a bottom portion thereof is connected to the wiring layer 17A and a top portion thereof is joined to the bump 13 of the semiconductor chip 11 bonded to the multi-layer flexible substrate 12A. With respect to the via 18B, a bottom portion thereof is connected to the wiring layer 17B and a top portion thereof is connected to the wiring layer 17A. With respect to the via 18C, a bottom portion thereof is connected to the wiring layer 17C and a top portion thereof is connected to the wiring layer 17B. Accordingly, the wiring layers 17A through 17C are interconnected via the vias 18A through 18C.

On the other hand, the wiring layer 17C, which is the lowermost layer of the multi-layers flexibel substrate 12A, is provided with a plurality of solder balls 19 serving as connecting terminals. Thus, the semiconductor chip 11 is electrically connected to the plurality of solder balls 19, via the bumps 13, the wiring layers 17A through 17C, and the vias 18A through 18C.

Herein, it should be noted that the via-holes 23, which form the vias 18A through 18C, are each shaped like a fine truncated cone. Accordingly, as shown in the drawings, a wall surface of each of the via-holes 23 is formed as an inclined surface. Also, a diameter of each of the via-holes 23 (see FIG. 2C) is designed to range between 20 μm and 70 μm, smaller than that of the via-holes of the conventional ceramic multi-layer substrate.

The via-holes 23 are formed by a laser process suitable for fine processing (discussed below). Thus, the organic insulation substrate layers 15A through 15C and filmy adhesive layers 16A through 16C are made of organic resin materials, and the laser process is used to form the via-holes 23 thereon. As a result, the via-holes 23 each with fine diameter can be easily and efficiently formed going through both the organic insulation substrate layers 15A through 15C and filmy adhesive layers 16A through 16C.

In other words, organic insulation substrate layers 15A through 15C and the filmy adhesive layers 16A through 16C are made of the organic resin materials such as epoxy, polyimide and so on. Unlike the conventional ceramic multi-layer substrate, these organic resin materials such as epoxy, polyimide and so on, do not need to be sintered during the forming of the substrate 12A and thereby the shrink of the green sheet due to the sintering does not occur. Further, the organic resin materials are easy to be processed and therefore the holes 23 can be easily formed thereon.

On the other hand, with respect to materials used for forming the metal via members 26, conductive metals such as Cu (copper), Ni (nickel), solder or the like may be selected. The metal via members 26 are formed within the respective via-holes 23 by means of a plating process that will be described later.

As previously described, the via-holes 23 are formed penetrating both of the organic insulation substrate layers 15A through 15C and filmy adhesive layers 16A through 16C, and the metal via members 26 are formed within the respective via-holes 23. In this configuration, the metal via members 26 are made of the same material within the respective via-holes 23. That is, the metal via members 26 are configured with continuous structures where there is no any joint on the boundaries between the organic insulation substrate layers 15A through 15C and the filmy adhesive layers 16A through 16C.

Thus, by using the identical material to form the metal via members 26 within the via-holes 23, reliability of the multi-layer flexible substrate 12A in the mounting of the semiconductor device 10A can be improved.

That is, when the semiconductor device 10A is heated in the mounting thereof, it is considered that a stress may be generated due to a difference in coefficient of thermal expansion between the organic insulation substrate layers 15A through 15C and filmy adhesive layers 16A through 16C. The stress may damage the vias 18A through 18C. Accordingly, if the vias 18A through 18C have the joints, whose strengths are weak, in positions facing the boundaries therebetween, it is possible that these joints thereof are damaged as previously described.

Accordingly, by forming the metal via members 26 with the identical material within the respective via-holes 23, the vias 18A through 18C can be formed without any joints in the positions facing to the boundaries and thereby the strengths thereof become strong. In this configuration, even if the above-mentioned stress is applied to the boundaries between the organic insulation substrate layers 15A through 15C and filmy adhesive layers 16A through 16C, the vias 18A through 18C are not damaged. As a result, the reliability of the multi-layer flexible substrate 12A (namely, reliability of the semiconductor device 10A) can be improved.

In addition, the multi-layer flexible substrate 12A has a frame member 20 provided on a surface thereof on which the semiconductor chip 11 is mounted. The frame member 20 serves to surround the multi-layer flexible substrate 12A. A rectangular aperture is formed in the center of the frame member 20, through which aperture the semiconductor chip 11 is mounted on the substrate 12A.

With respect to materials that may be used for making the frame member 20, metals such as Cu, Ni, AlSiC, 42alloy and the like may be suitable; or inorganic materials such as alumina, mulait, glass ceramic, aluminum nitride and the like may be suitable; or organic materials such as FR-4, FR-5, BT resin and the like may be suitable. Also, the frame member 20 may be fixed the multi-layer flexible substrate 12A by using organic adhesive such as epoxy, polyimide, cyanate ester, silicon or the like.

Herein, a description will be given below with respect to a method for manufacturing the multi-layer flexible substrate 12A of the first embodiment, with reference to FIGS. 2A through 2H and FIG. 3.

FIGS. 2A through 2H are diagrams illustrating the method of manufacturing the multi-layer flexible substrate 12A.

As shown in FIG. 2A, in order to manufacture the multi-layer flexible substrate 12A, the organic insulation substrate layer 15A and the filmy adhesive layer 16A are prepared.

Then, as shown in FIG. 2B, the filmy adhesive layer 16A adheres to the organic insulation substrate layer 15A.

After that, as shown in FIG. 2C, the via-holes 23 are formed by using a laser processing apparatus to emit laser light to the organic insulation substrate layer 15A, so that these holes 23 go through the organic insulation substrate layer 15A and the filmy adhesive layer 16A.

The laser used in this embodiment may be an excimer laser or a carbon-dioxide laser, whose oscillating wavelength is short and which is applicable to the fine processing by a powerful output.

By performing such a laser processing, the via-holes 23, each having a fine diameter R of ranging from 20 μm to 70 μm, can be easily and efficiently formed, compared to the conventional via-holes which are formed by a mechanical processing. In addition, the via-holes 23 are each shaped like the truncated cone as shown in FIG. 2C.

As shown in FIG. 2D, when the via-holes 23 are thus formed, a metal film 25 is applied to the filmy adhesive layers 16A. The metal film 25, which may be a conductive metal film such as a copper film or the like, serves to cover the via-holes 23.

Then, as can be understood from FIG. 2E, the organic insulation substrate layer 15A, on which the metal film 25 is applied to the filmy adhesive layers 16A, is sunk into a plating tank (not shown). In the plating tank, electrolytic plating is performed during which the metal film 25 serves as an electrode. Thus, the via members 26 are formed within the respective via-holes 23 by the electrolytic plating.

At this time, since the via-holes 23 are formed penetrating both of the organic insulation substrate layer 15A and the filmy adhesive layers 16A, the thus-plated metal via members 26 are each kept in a uniform and continuous state without any joint formed thereon. Further, since the metal via members 26 are formed within the respective via-holes 23 by the plating process, the forming of the metal via members 26 can be certainly and easily completed even when the diameters of the via-holes 23 are fine.

As shown in FIG. 2F, after the metal via members 26 are thus formed within the via-holes 23, respectively, the metal film 25 is removed and thereby the vias 18A are formed.

Next, as shown in FIG. 2G, the wiring layer 17A is formed under the organic insulation substrate layer 15A according to a predetermined pattern. The wiring layer 17A is connected to the vias 18A. A method for forming the wiring layer 17A may be a subtractive method, a semi-additive method, or an additive method.

After the wiring layer 17 is thus formed under the organic insulation substrate layer 15A, as shown in FIG. 2G, a first single part including the organic insulation substrate layer 15A, the filmy adhesive layer 16A, the via 18A and the wiring layer 17A is formed.

Next, the processes shown in FIGS. 2A through 2G are repeated so as to form a second single part including the organic insulation substrate layer 15B, the filmy adhesive layer 16B, the via 18B and the wiring layer 17B. Thus, as shown in FIG. 2H, the second single part is attached to a bottom surface of the organic insulation substrate layer 15A of the first single part.

Further, by repeating the processes shown in FIGS. 2A through 2G, a third single part including the organic insulation substrate layer 15C, the filmy adhesive layer 16C, the via 18C and the wiring layer 17C can be formed. After that, the third single part is attached to a bottom surface of the organic insulation substrate layer 15B shown in FIG. 2H.

Figure 2:
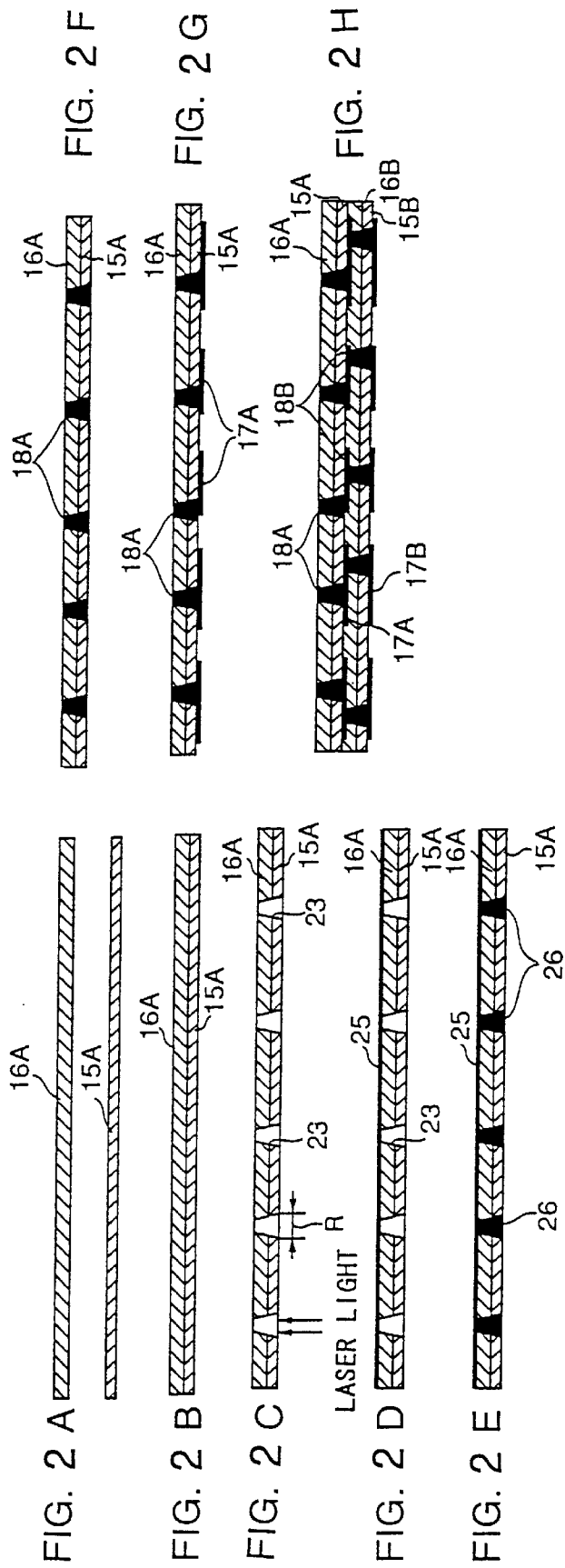
FIGS. 2A through 2H illustrate a method for manufacturing a multi-layer flexible substrate used for forming the semiconductor device of the first embodiment.
Figure 3:
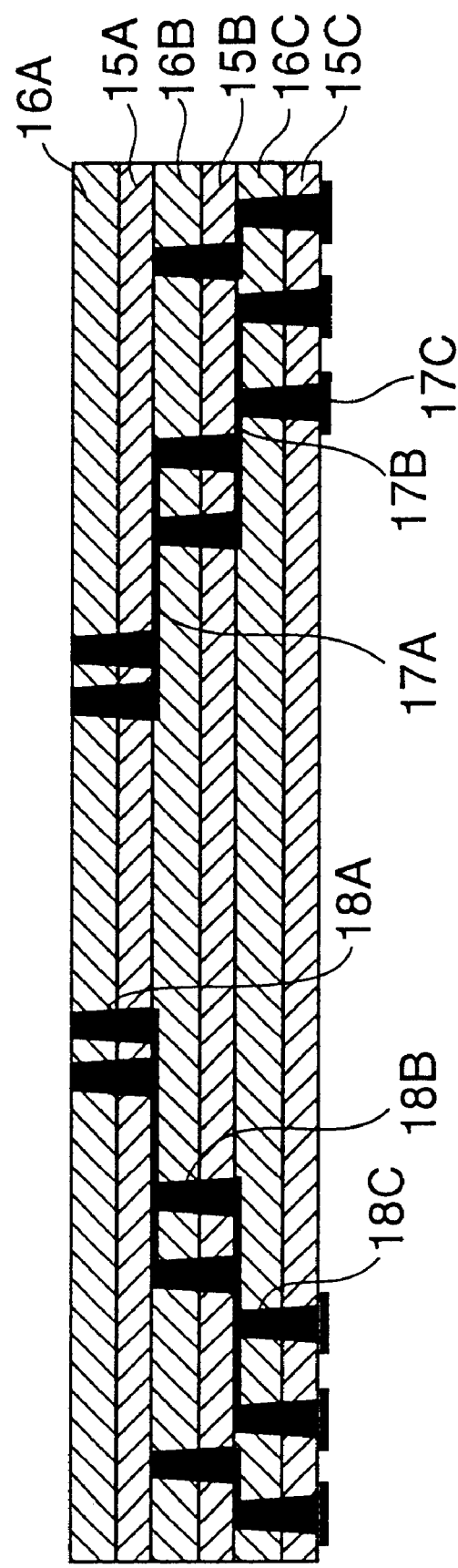
FIG. 3 is an enlarge diagram showing the multi-layer flexible substrate used for forming the semiconductor device of the first embodiment.

As can be seen from FIG. 3, the multi-layer flexible substrate 12A including the first through third single parts is thus formed by repeating the previously described processes shown in FIGS. 2A through 2G.

Then, the semiconductor chip 11 is bonded to the multi-layer flexible substrate 12A in a flip-down state, and then underfill resin 14A is introduced therebetween. Further, by providing the frame member 20 to surround the semiconductor chip 11, the semiconductor device 10A shown in FIG. 1 is completed.

Figure 4:
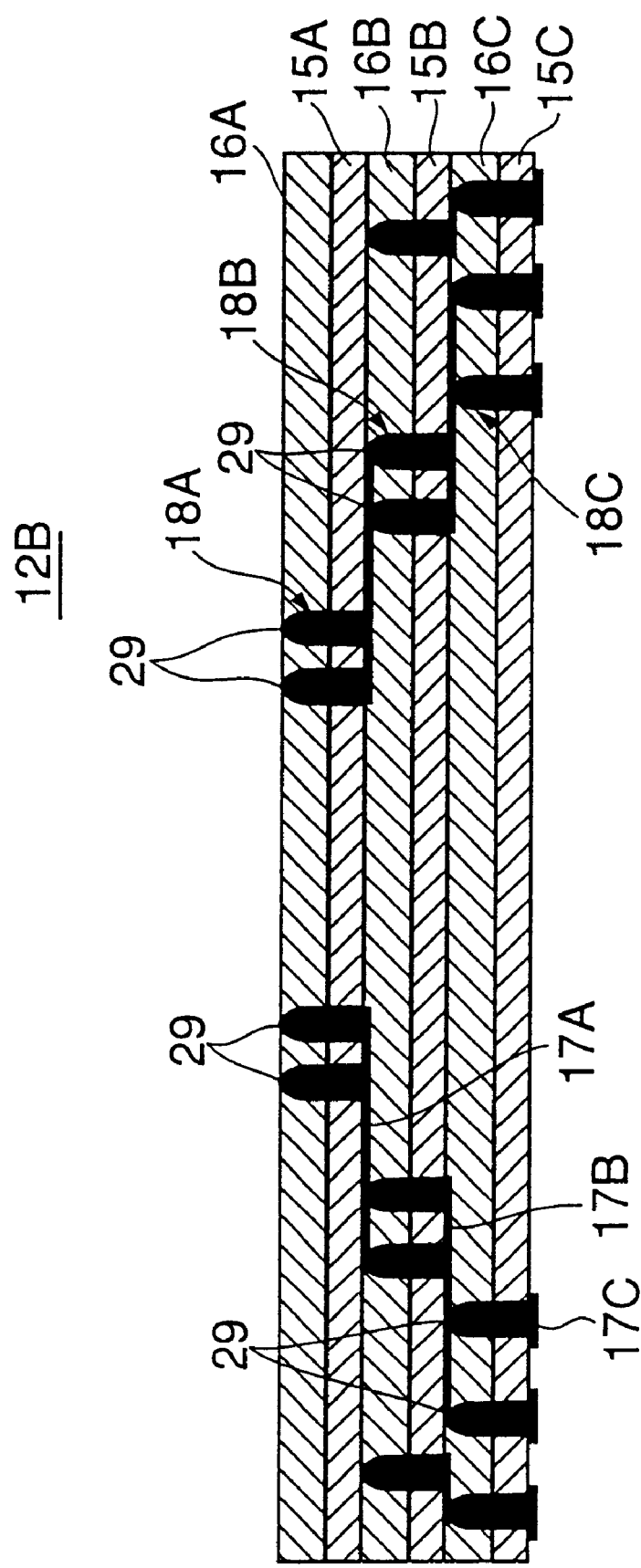
FIG. 4 is a cross-section view showing a modification of the multi-layer flexible substrate of FIG. 3.
Figure 5:
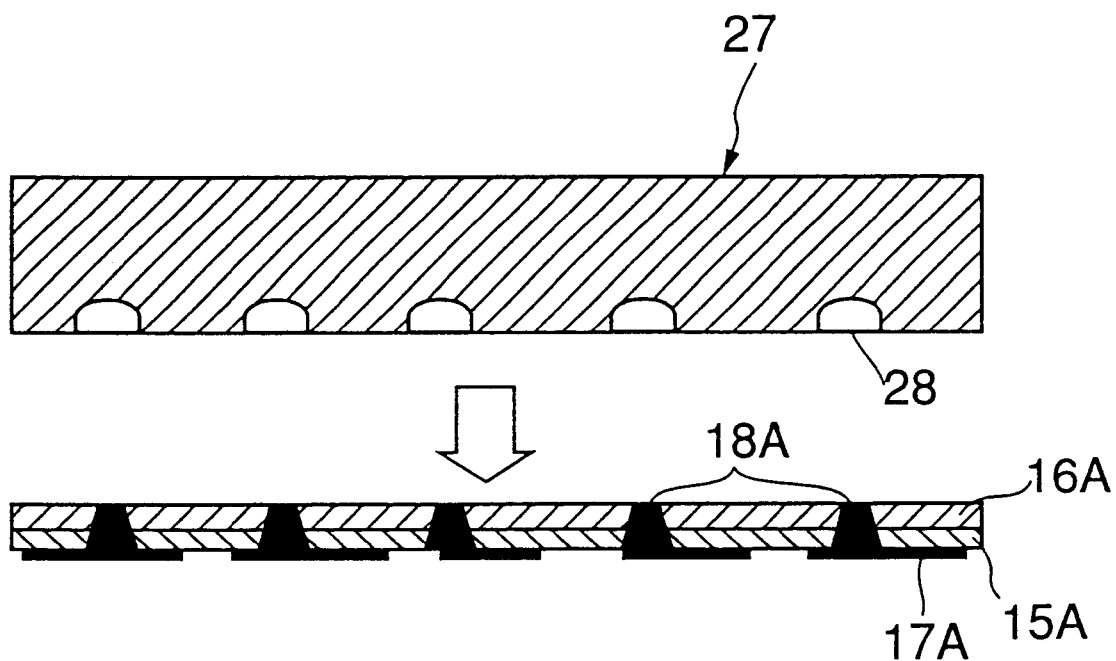
FIG. 5 is a diagram illustrating a method for manufacturing a modified one of the multi-layer flexible substrate of FIG. 3.

FIGS. 4 and 5 are diagrams for illustrating a multi-layer flexible substrate 12B as a modification of the above-mentioned multi-layer flexible substrate 12A and a method for manufacturing the modification.

As shown in FIG. 4, unlike the multi-layer flexible substrate 12A, in the multi-layer flexible substrate 12B, sharp portions 29 are provided on end portions of the vias 18A through 18C, respectively. There is an advantage in this configuration that, during the stacking process from FIG. 2G to FIG. 2H, since the via 18B is connected to the wiring layer 17A in a state of the sharp portion 29 thereof sticking in the wiring layer 17A, electrical connection therebetween can be improved. Similarly, during the stacking process from FIG. 2H to FIG. 3, electrical connection between the via 18C and the wiring layer 17B can be improved as well.

Further, while the semiconductor chip 11 is bonded to the multi-layer flexible substrate 12B, since the sharp portions 29 are provided on the end portions of the vias 18A, the via 18A is connected to the bump 13 in a state of sticking in the bump 13. Accordingly, electrical connection between the semiconductor chip 11 and the multi-layer flexible substrate 12B can be improved.

As previously described, the sharp portions 29 of the vias 18A through 18C are formed by using a forming tool 27 shown in FIG. 5. The forming tool 27 may be, for example, a flat silicon substrate or a metal plate, where a plurality of concave portion 28 are formed by means of a mechanical processing such as an eximer laser, a carbon-dioxide laser or the like or by means of a chemical processing such as etching or the like. Then, the tool 27 with the plurality of concave portions 28 is strongly pressed upon the vias 18A (18B, 18C) after the process of FIG. 2G, and thereby the sharp portions 29 are formed on the end portions of the vias 18A (18B, 18C).

Next, a description will be given below with respect to a semiconductor device 10B of a second embodiment according to the present invention.

Figure 6:
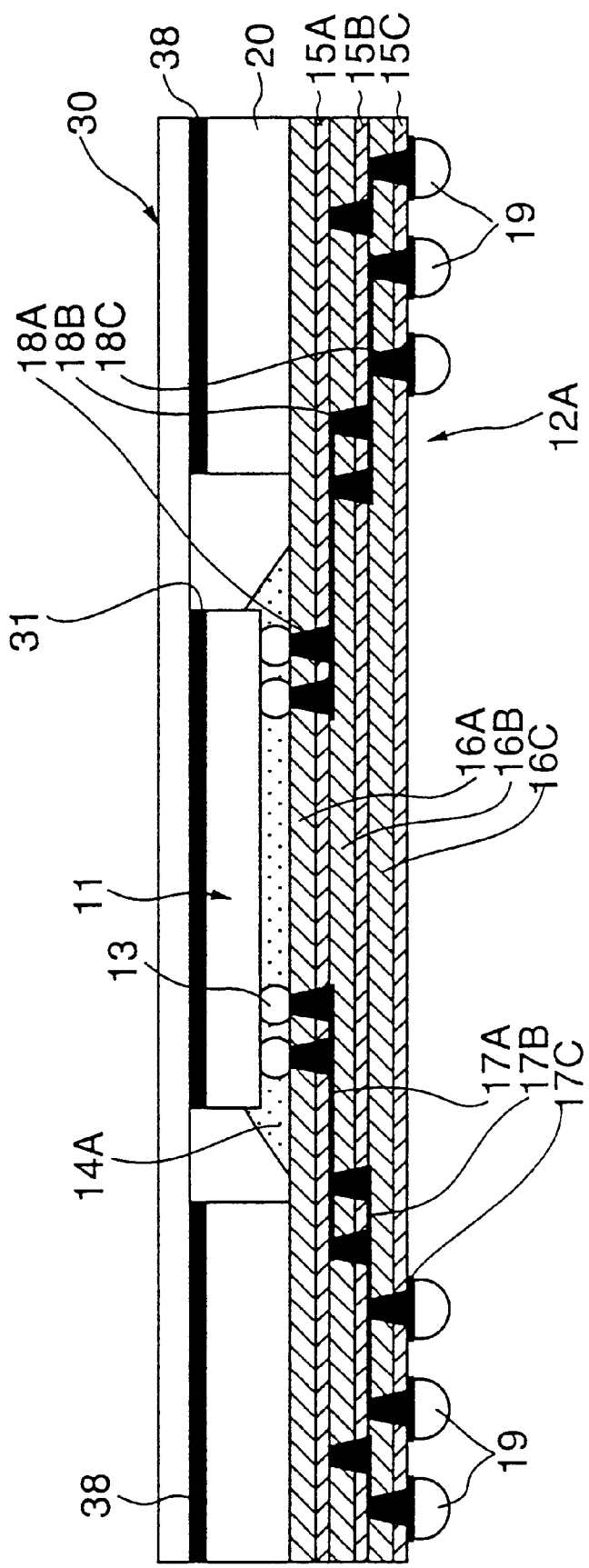
FIG. 6 is a cross-section view showing a semiconductor device of a second embodiment according to the present invention.

FIG. 6 is a cross-section view showing the semiconductor device 10B of the second embodiment. In this diagram and in other diagrams to be described later, parts which are the same as those of FIG. 1 through FIG. 4 are given the same reference numerals, and a description thereof is omitted.

Unlike the semiconductor device 10A, the semiconductor device 10B, a heat spreader 30 is further provided on the frame member 20. The heat spreader 30 is plate member that may be made of a metal material such as Cu (copper), Ni (nickel), AlSiC, 42alloy or the like, or of an inorganic material such as alumina, murait, glass ceramic, aluminum nitride or the like, or of an organic material such as FR-4, FR-5, BT resin or the like. Also, the heat spreader 30 is fixed on the frame member 20 by organic adhesive 38 such as epoxy, polyimide, cyanate ester, silicon or the like. Moreover, between the semiconductor chip 11 and the heat spreader 30, adhesive 31 with high thermal conductivity is introduced.

According to this configuration of the second embodiment, heat generated by the semiconductor chip 11 is discharged to the heat spreader 30 through the thermal conductive adhesive 31. Also, as showing in FIG. 6, since the heat spreader 30 has a larger surface for discharging the heat generated by the semiconductor chip 11, the heat can be efficiently discharged to the outside. Further, according to the second embodiment, the semiconductor chip 11 is contained within a hollow housing formed by the multi-layer flexible substrate 12A, the frame member 20 and the heat spreader 30, and therefore the protection of the semiconductor chip 11 can be certainly ensured.

Next, a description will be given below with respect to a semiconductor device 10C of a third embodiment according to the present invention.

Figure 7:
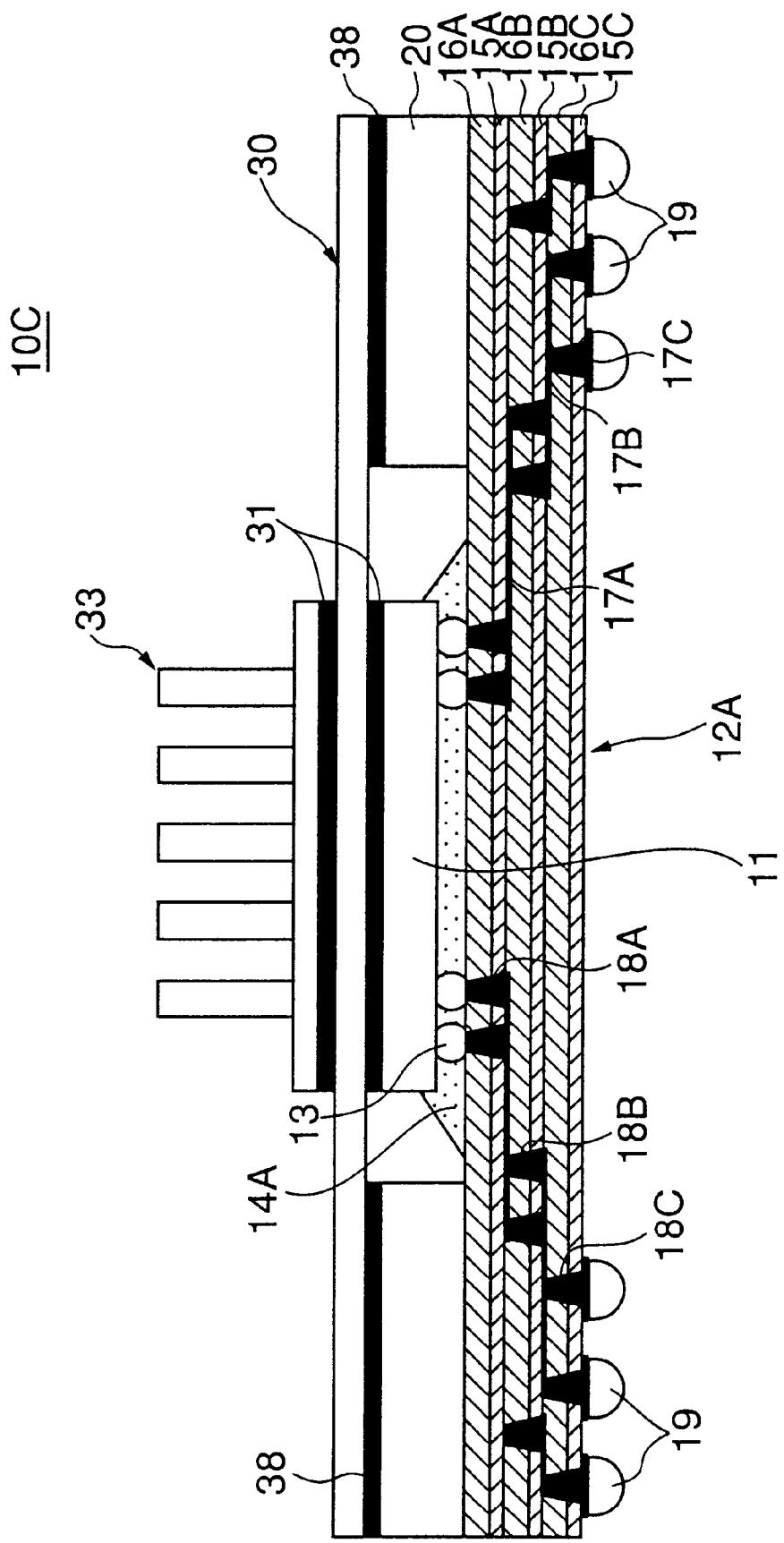
FIG. 7 is a cross-section view showing a semiconductor device of a third embodiment according to the present invention.

FIG. 7 is a cross-section view showing the semiconductor device 10C of the third embodiment. Unlike the semiconductor device 10B, in the semiconductor device 10C, a plurality of heat discharging fins 33 are further provided on the heat spreader 30.

The plurality of heat discharging fins 33 may be each made of a metal material or an inorganic material either of which has high thermal conductivity, and are shaped like a comb so that a heat discharging surface thereof can be enlarged. Further, the plurality of heat discharging fins 33 are fixed on the heat spreader 30 by the thermal conductive adhesive 31. Thus, by providing the thermal conductive adhesive 31 on the heat spreader 30, heat discharging characteristics of the semiconductor chip 11 can be further improved.

In addition, in the third embodiment, besides being fixed on the heat spreader 30 by the thermal conductive adhesive 31, the heat discharging fins 33 may be fixed thereon by a mechanical method, namely, using screws, sockets, or the like.

Next, a description will be given below with respect to a semiconductor device 10D of a fourth embodiment according to the present invention.

Figure 8:
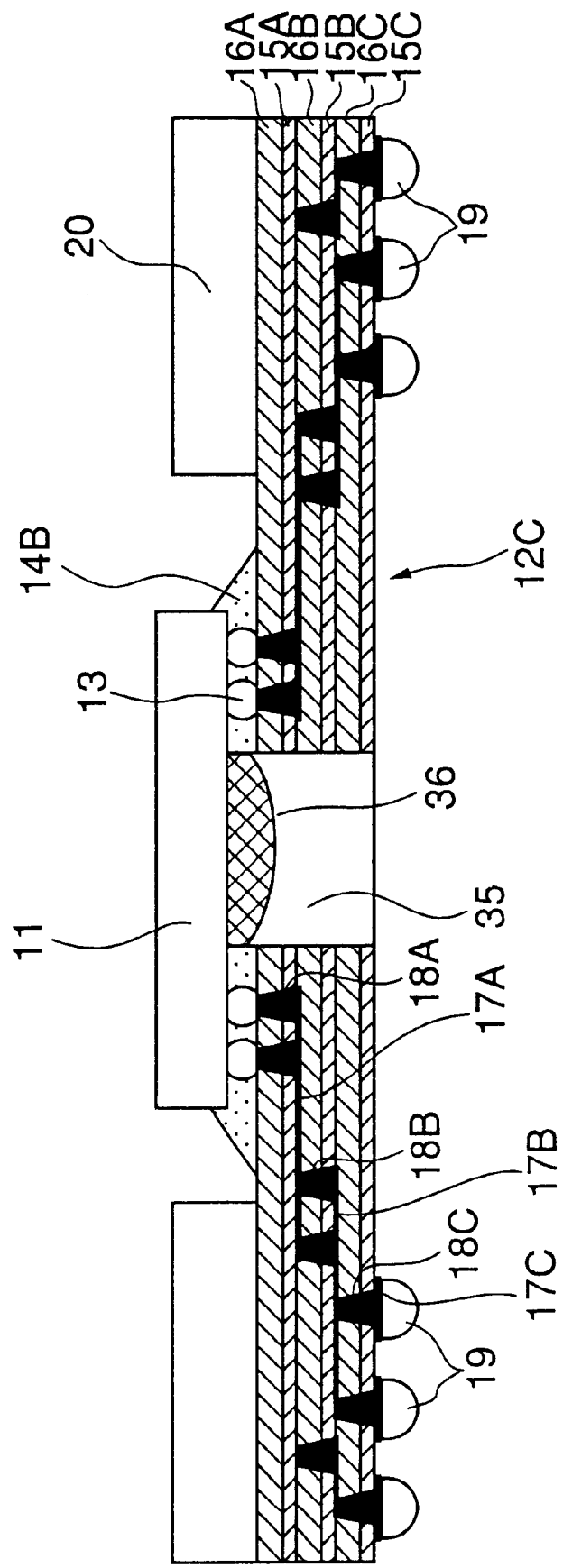
FIG. 8 is a cross-section view showing a semiconductor device of a fourth embodiment according to the present invention.
Figure 9:
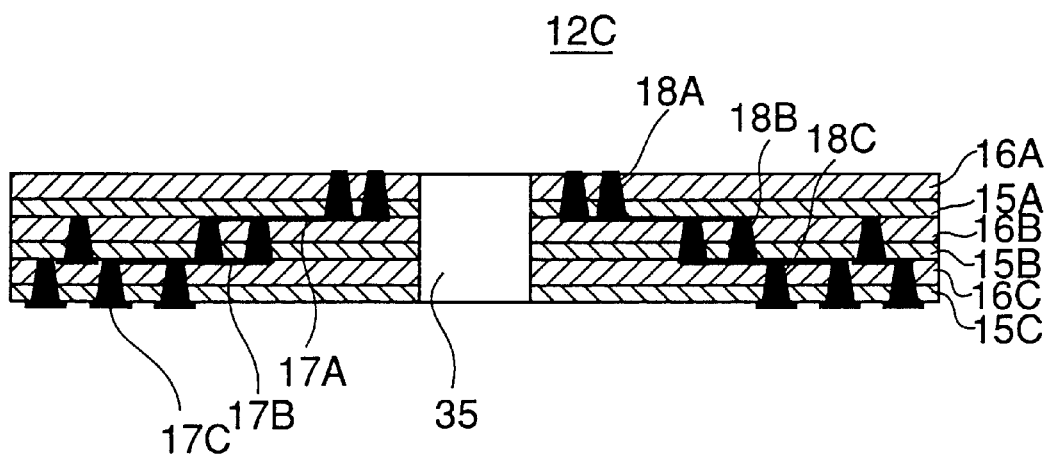
FIG. 9 is an enlarge diagram showing the multi-layer flexible substrate used for forming the semiconductor device of the fourth embodiment.

FIG. 8 is a cross-section view showing the semiconductor device 10D of the fourth embodiment. FIG. 9 is a cross-section view showing a multi-layer flexible substrate 12C used in the semiconductor device 10D.

Unlike the semiconductor device 10A of the first embodiment of FIG. 1, in the semiconductor device 10D, there is an opening portion formed in a position of the multi-layer flexible substrate 12C facing toward the semiconductor chip 11. Further, sealing resin 36 for protecting the semiconductor chip 11 is formed within the opening portion 35. The sealing resin 36 may be made of, for example, epoxy resin and formed therein by means of a bonding process.

Herein, it should be noted that an area of the opening portion 35 is designed to be smaller than that of the semiconductor chip 11, because the opening portion 35 has to be sized and positioned dependent on the bumps provided on the semiconductor chip 11. That is, as shown in FIG. 8, the opening portion 35 is formed a place, outside which the bumps 13 are formed.

According to this configuration, after the semiconductor chip 11 is bonded to the multi-layer flexible substrate 12C by means of a face-down bonding process, the underfill resin 14B can be introduced therebetween via the opening portion 35.

Thus, in the fourth embodiment, that the underfill resin 14B is introduced from the inside to the outside of the semiconductor chip 11 can save time and decrease the occurrence of voids, compared to the other embodiments where the underfill resin 14A is introduced from an outer periphery of the semiconductor chip 11. Accordingly, by forming the previously described opening portion 35, the underfill resin 14B can be more efficiently and uniformly introduced.

Figure 10:
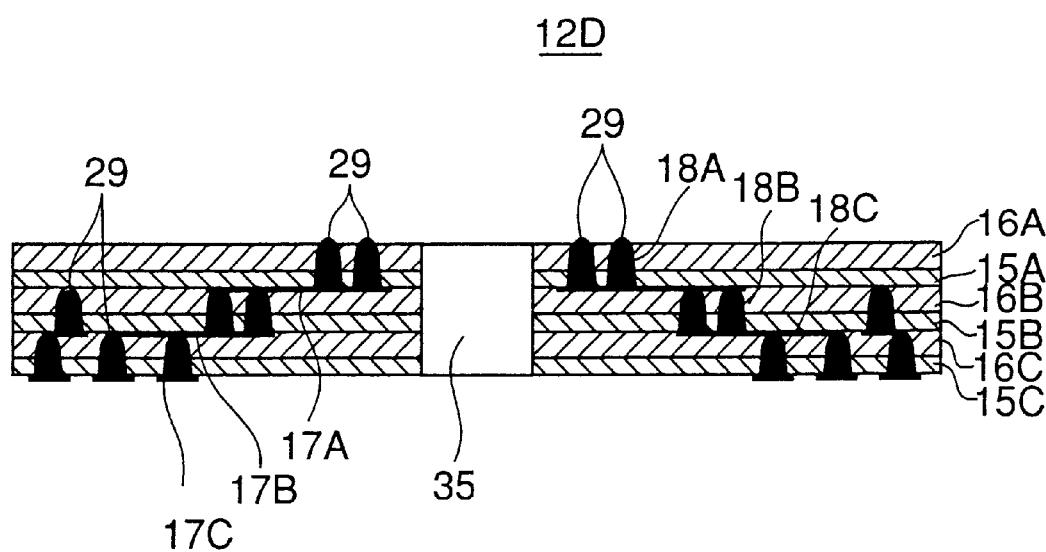
FIG. 10 is a cross-section view showing a modification of the multi-layer flexible substrate of FIG. 9.

In addition, FIG. 10 is a cross-section view showing a multi-layer flexible substrate 12D as a modification of the multi-layer flexible substrate 12C of FIG. 9. As shown in FIG. 10, the opening portion 35 is provided on the multi-layer flexible substrate 12D where the vias 18A through 18C having the sharp portions 29 are formed. This modification can contribute the same effects described above.

In the previously described embodiments, the vias 18A through 18C provided on the multi-flexible substrates 12A through 12D are formed such that the metal members 26 are formed within the via-holes 23 by using the identical material. In this configuration, there is no joint within the vias 18A through 18C. Accordingly, even the stress is applied to the boundaries of the organic insulation substrate layers 15A through 15C and the filmy adhesive layers 16A through 16C, the vias 18A through 18C will not be damaged and therefore the reliability of the multi-flexible substrates 12A through 12D can be improved. Also, in the method for forming the multi-flexible substrates 12A through 12D, after the metal via members 26 are formed within the via-holes 23 by means of a via forming process, the wiring layers 17A through 17C are formed by means of a process other than the via forming process.

Since the process of forming the vias 18A through 18C is different from that of the wiring layers 17A through 17C, the vias 18A through 18C and the wiring layers 17A through 17C should be joined to each other. However, joint strengths on boundaries therebetween are weaker than those on the metal via members 26 continuously formed. For this reason, when the stress is applied to the boundaries between the vias18A through 18C and the wiring layers 17A through 17C, it is possible that the boundaries may be damaged. Moreover, it is troublesome that the wiring layers 17A through 17C are formed by means of the process other than the process of forming the vias 18A through 18C.

In order to overcome these disadvantages, a description is given below with respect to a multi-flexible substrate 12E and a method for manufacturing the same with reference to FIG. 11. In addition, in FIG. 11, parts, which are the same as those in FIG. 2, are given the same reference numerals and a description thereof is omitted.

Unlike the multi-flexible substrates 12A through 12D where the wiring layers 17A through 17C are formed separately from the vias 18A through 18C, in the multi-flexible substrates 12E, wiring layers 17D and 17E are formed together with vias 18D and 18E made of the metal members 38 and 39.

As shown in FIG. 11A, in order to manufacture the multi-layer flexible substrate 12E of this embodiment, the organic insulation substrate layer 15A and the filmy adhesive layer 16A are prepared.

Then, as shown in FIG. 11B, the filmy adhesive layer 16A is applied to the organic insulation substrate layer 15A so that the two layers form a substrate body 40A.

After that, as shown in FIG. 11C, laser light emitted by a laser processing apparatus from a side of the organic insulation substrate layer 15A so as to form the holes 23 going through the substrate body 40A.

The laser used herein may be the excimer laser or the carbon-dioxide laser, whose oscillating wavelength is short and which is applicable to the fine processing by the powerful output.

By performing the laser processing, the via-holes 23 are each shaped like the truncated cone as shown in FIG. 11C. At this time, a vertical angle $\theta$ of the truncated via-hole 23, which can range from the 10° to 90°, is defined by controlling an output: power and an emitting angle of the laser.

As shown in FIG. 11D, when the via-holes 23 are thus formed, a metal film 25 is applied to the filmy adhesive layers 16A. The metal film 25, which may be a conductive metal film such as a copper film or the like, serves to cover the via-holes 23.

Also, as shown in FIG. 11E, resists 37 are provided under the organic insulation substrate layer 15A. These resists 37 are formed on places other than places where the wiring layer 17D is formed. In addition, these resists 37 are photoresists and are formed by the well-known photolythography technology.

Then, as can be understood from FIG. 2E, the substrate body 40A, where the metal film 25 is applied to the filmy adhesive layers 16A, is sunk into the plating tank (not shown). In the plating tank, the electrolytic plating process is performed during which the metal film 25 serves as the electrode. Thereby, the via members 38 are formed within the respective via-holes 23 and continuously the wiring layer 17D is formed as well. In other words, during the electrolytic plating process, the metal via members 38 are first deposited along inner walls of the via-holes 23 and thereafter the wiring layer 17D is deposited on the places where the resists 37 are not provided.

FIG. 11E shows a state in which the metal via members 38 are formed on the inner walls of the via-holes 23 and continuously the wiring layer 17D is formed. In this state, the deposited metal via members 38 only form concave portions in the via-holes 23 without filling up the via-holes 23.

Thereafter, as shown in FIG. 11F, by continue performing the electrolytic plating, the metal via members 38 are further deposited on the concave portions until the via-holes 23 are filled up by the metal via members 38.

As shown in FIG. 11G, after the metal via members 38 are thus formed within the via-holes 23, the metal film 25 is removed therefrom and thereby the vias 18D are formed. In this configuration of the vias 18D, since the via-holes 23 go through the organic insulation substrate layer 15A and the filmy adhesive layer 16A, the plated metal via members 38 are kept in the continuous state without joints.

Further, in this embodiment, since the metal via members 38 and the wiring layer 17D are formed integrally, they have a continuous configuration without any joint.

Accordingly, the strength of the vias 18D become strong enough to avoid the vias 18D being damaged even if the stress is applied to the boundary between the organic insulation substrate layer 15A and the filmy layer 16A or to the boundaries between the metal via members 38 and the wiring layer 17D. As a result, the reliability of the substrate (namely, the reliability of the semiconductor device) can be improved.

It should be noted that in order to continuously form the metal via members 38 and the wiring layer 17D, the via-holes 23 should be shaped like the truncated cones. Several experiments have been performed on various shapes of the via-holes 23. As a result, in a case where the via-holes 23 are shaped like cylinders, or in a case where the via-holes 23 are shaped like reverse truncated cones, the metal via members 38 and the wiring layer 17D cannot be continuously formed. Further, that the vertical angel θ is set to range from 10° to 90° can contribute to efficiency of the metal via members 38 being deposited and being certainly formed within the via-holes 23.

As previously described, after the vias 18D and wiring layer 17D are simultaneously formed in the organic insulation substrate layer 15A and the filmy adhesive layer 16A, the substrate body 40A is completed. Then, the processes shown by FIG. 11A through FIG. 11G are repeated so as to form a substrate body 40B including the organic insulation substrate layer 15B, the filmy adhesive layer 16B, the vias 18E and the wiring layer 17E.

As shown in FIG. 11H, by attaching the substrate body 40B to the organic insulation substrate layer 15A of FIG. 11G, the multi-flexible substrate 12E is thus manufactured.

In addition, the multi-flexible substrate 12E shown by FIG. 11H has a two-layer configuration, however, by repeating the above-mentioned processes, a multi-flexible substrate with more than two layers can be easily manufactured.

The above description is provided in order to enable any person skilled in the art to make and use the invention and sets forth the best mode contemplated by the inventors for carrying out their invention.

The present application is based on Japanese priority application No. 11-289937 filed on Oct. 12, 1999, the entire contents of which are hereby incorporated by reference.

It should be understood that various alternatives to the embodiments of the invention described herein may be employed in practicing the invention. It is intended that the following claims define the scope of the invention and that structures and methods within the scope of these claims and their equivalents be covered thereby.

What is claimed is:

1. A semiconductor device, comprising:

a substrate having a plurality of organic insulation substrate layers and a plurality of adhesive layers which are alternatively stacked, and inter-layer wires which are laid among said stacked layers and are electrically interconnected by using vias; and a semiconductor chip mounted on said substrate;

said vias each having a via-hole which is formed penetrating said organic insulation substrate layers and said adhesive layers and a metal via member which is disposed in said via-hole and made of an identical material, wherein:

said substrate includes an opening which is formed in a position facing toward said semiconductor chip;

said semiconductor chip is bonded to said substrate by means of a face-down bonding process; and underfill resin is introduced between said semiconductor chip and said substrate.

2. A semiconductor device, comprising:

a substrate having a plurality organic insulation substrate layers and a plurality of adhesive layers which are alternatively stacked, and inter-layer wires which are laid among said stacked layers and are electrically interconnected by using vias; and a semiconductor chip mounted on a said substrate;

said vias each having a via-hole which is formed penetrating said organic insulation substrate layers and said adhesive layers and a metal via member which is disposed in said via-hole and made of an identical material, wherein said via-holes are shaped like truncated cones.

\* \* \* \* \*